(12) United States Patent
Hong et al.

(10) Patent No.: US 7,625,843 B2
(45) Date of Patent: Dec. 1, 2009

(54) METHOD FOR MANUFACTURING A METAL ORGANIC DEPOSITION PRECURSOR SOLUTION USING SUPER-CONDUCTION OXIDE AND FILM SUPERCONDUCTOR

(75) Inventors: Gye-Won Hong, Seongnam-si (KR); Hee-Gyon Lee, Daejeon (KR); Sang-Im Yoo, Seoul-si (KR); Jai-Moo Yoo, Gyeongsangnam-do (KR)

(73) Assignee: Korea Institute of Machinery & Materials, Daejeon (KR)

( * ) Notice: Subject to any disclaimer, the term of this patent is extended or adjusted under 35 U.S.C. 154(b) by 0 days.

(21) Appl. No.: 11/332,494

(22) Filed: Jan. 13, 2006

(65) Prior Publication Data

US 2006/0246216 A1 Nov. 2, 2006

(30) Foreign Application Priority Data

Jul. 18, 2003 (KR) ............ 10-2003-0049157
Jul. 15, 2004 (WO) ............ PCT/KR2004/001756

(51) Int. Cl.
*H01L 39/24* (2006.01)
(52) U.S. Cl. ............ 505/470; 335/216; 427/62; 505/100; 505/230; 505/440; 252/500; 252/521.1
(58) Field of Classification Search ............ 505/440, 505/434, 100, 230, 470; 427/62; 252/500, 252/521.1; 335/216
See application file for complete search history.

(56) References Cited

U.S. PATENT DOCUMENTS 4,996,189 A * 2/1991 Kourtakis et al. ............ 505/481
5,141,918 A * 8/1992 Hirano ............ 505/446
5,231,074 A * 7/1993 Cima et al. ............ 505/434

(Continued)

FOREIGN PATENT DOCUMENTS

| EP | 0431813 A1 | * | 11/1990 |
| JP | 01-230405 | * | 9/1989 |
| JP | 2002-201157 | * | 7/2002 |
| JP | 2002-284526 | * | 10/2002 |
| JP | 2003-034527 | * | 7/2003 |

OTHER PUBLICATIONS

J.A. Smith et al., High Critical Current Density Thick MOD-Derived YBCO films, IEEE Tansactions on Applied Superconductivity, vol. 9, No. 2, Jun. 1999.*

(Continued)

*Primary Examiner*—Mark Kopec
*Assistant Examiner*—Khanh Tuan Nguyen
(74) *Attorney, Agent, or Firm*—Michael Best & Friedrich LLP

(57) ABSTRACT

There is provided a method of fabricating a precursor solution for a metal organic deposition method using a superconducting oxide as a starting material, wherein the method includes dispersing a superconducting material powder in a TFA acid aqueous solution, heating to dissolve the powder in the TFA solution, increasing a temperature of a hot substrate if the powder is completely dissolved and the solution is clear, continuously heating until the solution is vaporized and is in a viscous jelly state, stopping heating if the solution loses its flowing property completely, cooling the solution, and dissolving the compound in the jelly state, hardened at a room temperature, into an organic solvent to provide a metal organic deposition solution for coating. There is also provided a method of fabricating a thin film-type superconductor using a metal organic deposition method.

12 Claims, 5 Drawing Sheets

U.S. PATENT DOCUMENTS

| | | | | |
|---|---|---|---|---|
| 5,429,791 | A * | 7/1995 | Lee et al. | 505/433 |
| 5,525,584 | A * | 6/1996 | Murakami et al. | 505/450 |
| 5,849,667 | A * | 12/1998 | Murakami et al. | 505/125 |
| 5,920,246 | A * | 7/1999 | Nagashima et al. | 335/216 |
| 5,968,878 | A * | 10/1999 | Kojo et al. | 505/450 |
| 6,013,313 | A | 1/2000 | Nunan et al. | |
| 6,332,967 | B1 * | 12/2001 | Bhattacharya | 205/51 |
| 6,486,100 | B1 * | 11/2002 | Lee et al. | 505/470 |
| 6,500,733 | B1 | 12/2002 | Stanbery | |
| 6,524,643 | B1 * | 2/2003 | Nakamura et al. | 427/62 |
| 6,821,930 | B2 * | 11/2004 | Araki et al. | 505/440 |
| 7,069,065 | B2 * | 6/2006 | Araki et al. | 505/230 |
| 7,326,434 | B2 * | 2/2008 | Rupich et al. | 427/62 |
| 2005/0007227 | A1 * | 1/2005 | Lee et al. | 335/216 |
| 2005/0127133 | A1 * | 6/2005 | Selvamanickam | 228/101 |
| 2006/0240989 | A1 * | 10/2006 | Bock et al. | 505/100 |

OTHER PUBLICATIONS

McIntyre, Paul C. et al., Effect of growth conditions on the properties and morphology of chemically derived epitaxial thin films of $Ba_2Y cu_3O_{7-x}$ on (001) $LaAlO_3$, J. Appl. Phys., vol. 71, No. 4, pp. 1868-1877, pp. 1868-1877.*

McIntyre, Paul C. et al., "Effect of growth conditions on the properties and morphology of chemically derived epitaxial thin films of $Ba_2Y cu_3O_{7-x}$ on (001) $LaAlO_3$," J. Appl. Phys., Feb. 15, 1992, vol. 71, No. 4, pp. 1868-1877, pp. 1868-1877.*

\* cited by examiner

[Fig. 1]
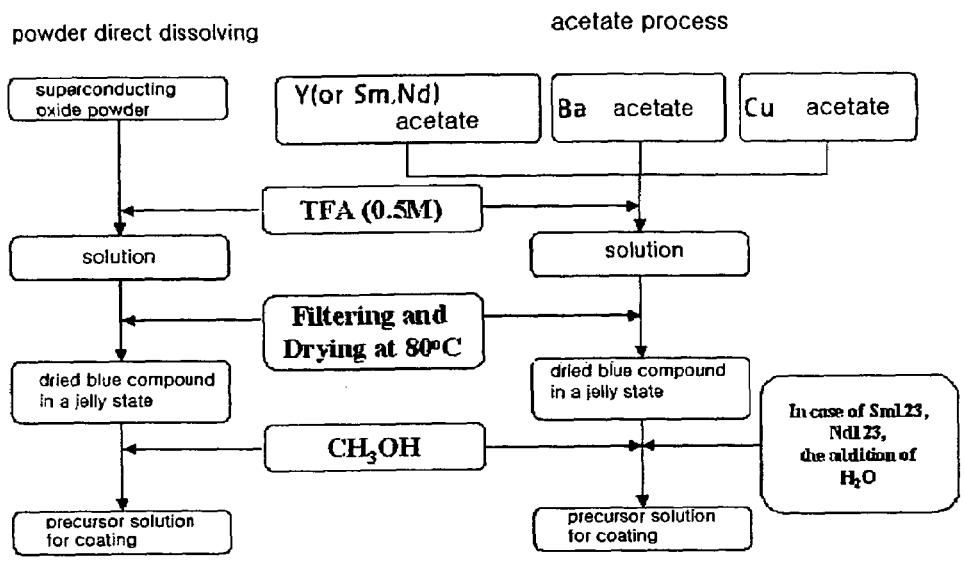
[Fig. 2]
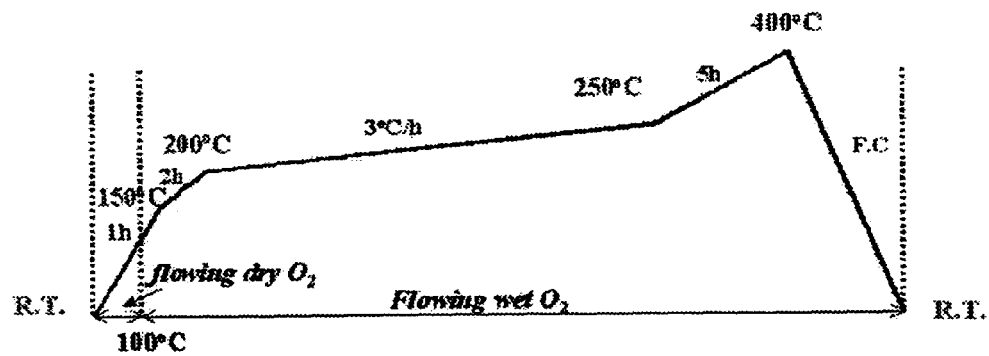
R.T : Room Temperature
flowing dry $O_2$: without moisture
flowing wet $O_2$: including moisture
F.C : furnace cooling

[Fig. 3]
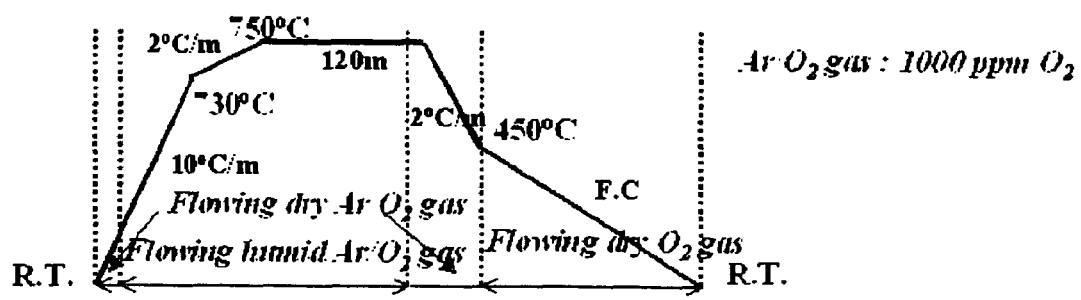
[Fig. 4]
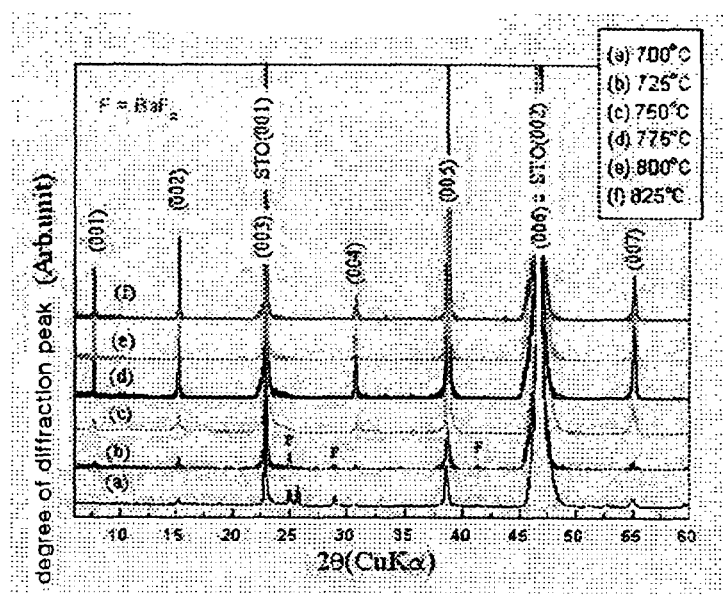

[Fig. 5]
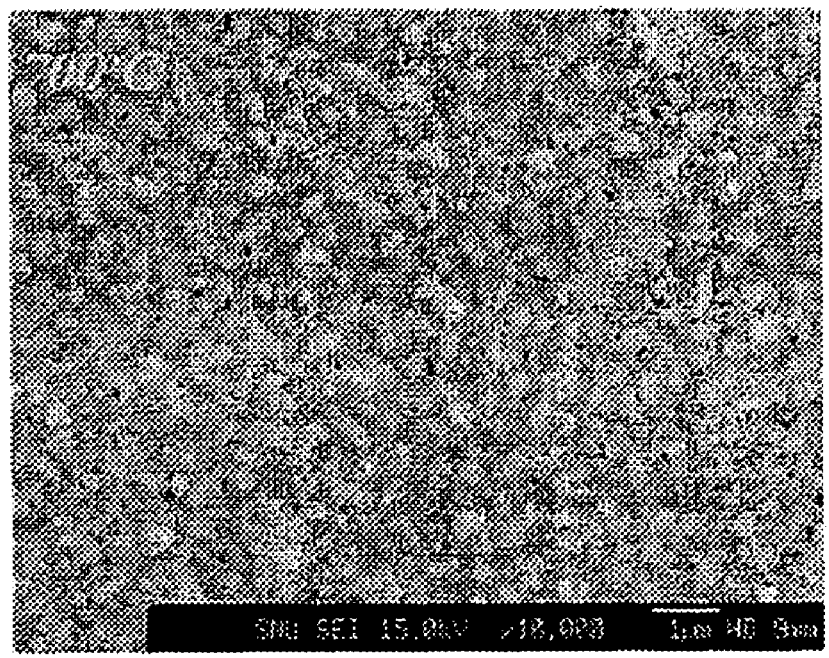
[Fig. 6]
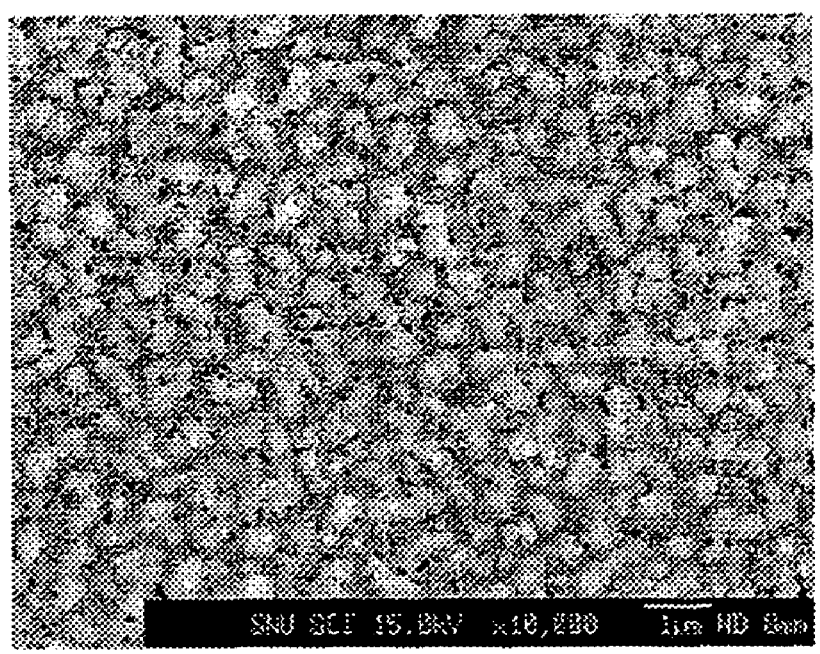

[Fig. 7]
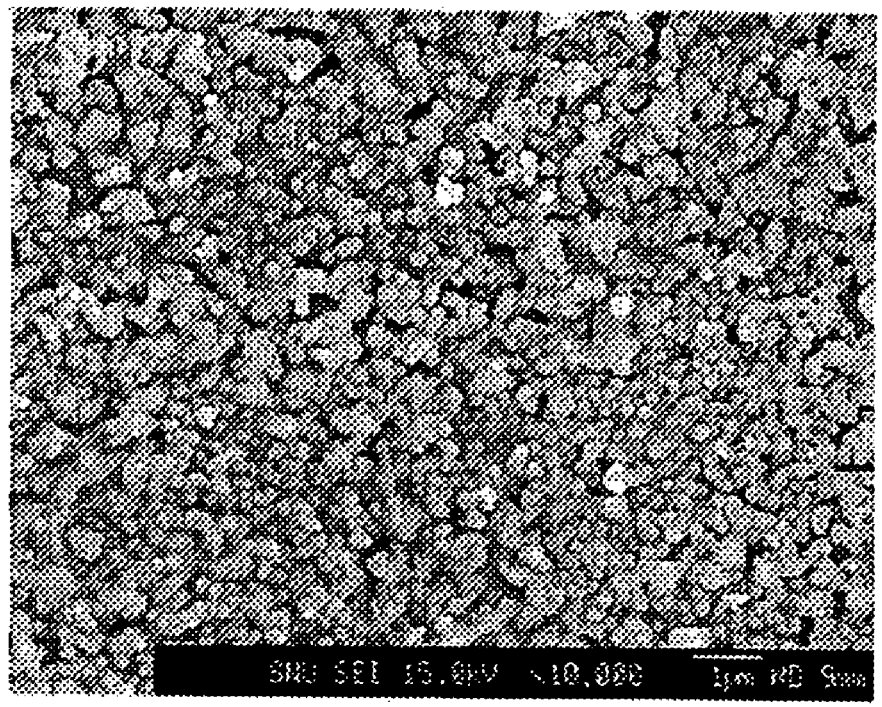
[Fig. 8]
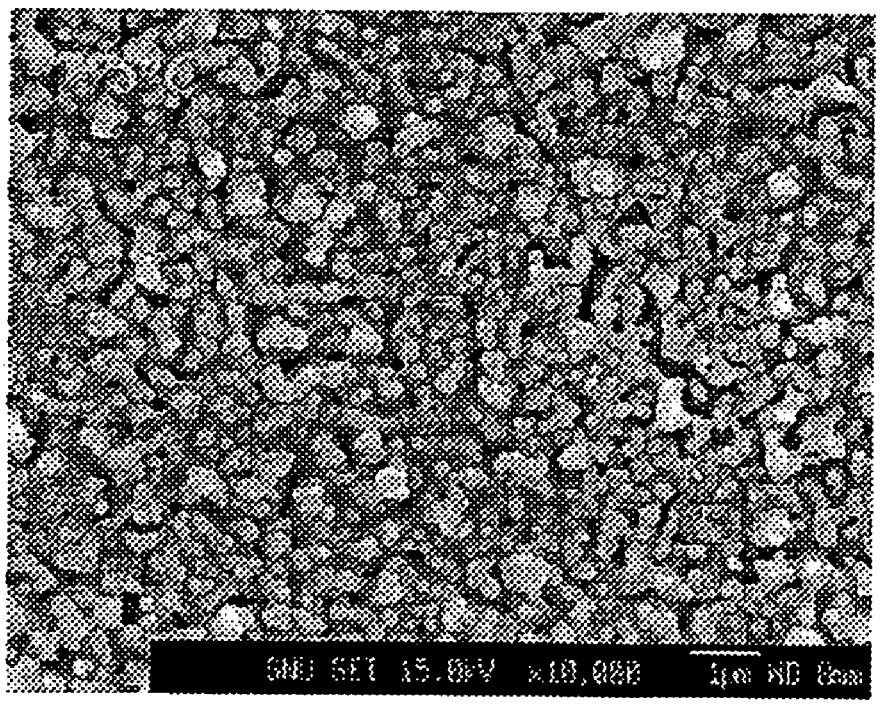

[Fig. 9]
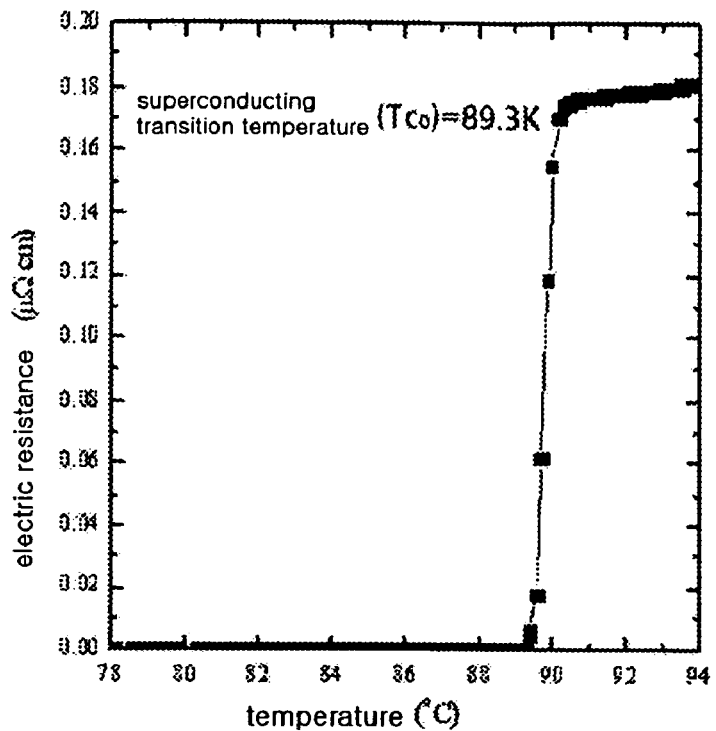
[Fig. 10]
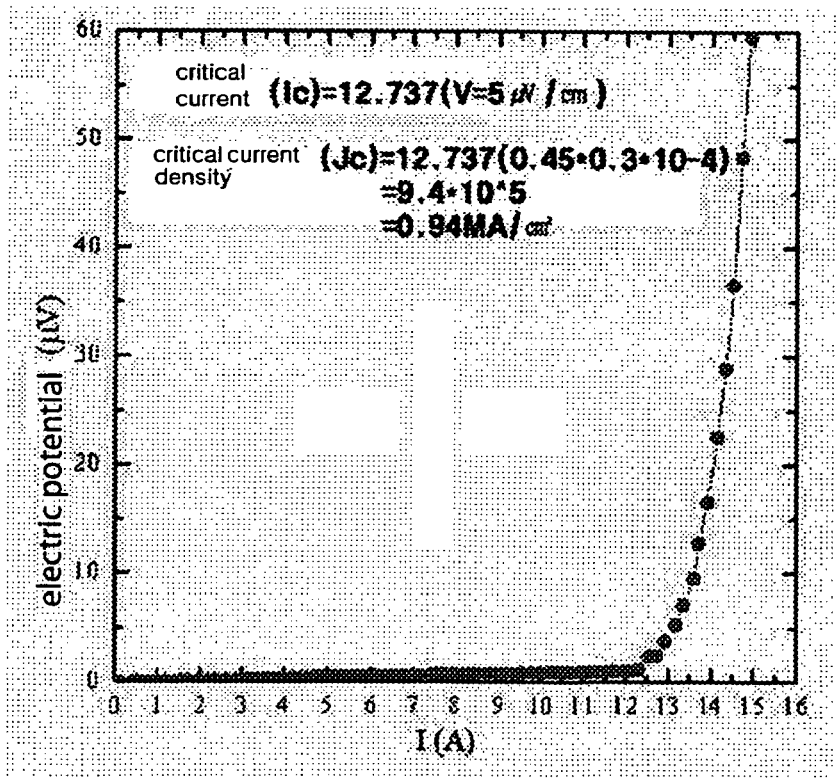

METHOD FOR MANUFACTURING A METAL ORGANIC DEPOSITION PRECURSOR SOLUTION USING SUPER-CONDUCTION OXIDE AND FILM SUPERCONDUCTOR

CROSS-REFERENCE TO RELATED APPLICATIONS

Priority is hereby claimed to international patent application number PCT/KR2004/001756 filed on Jul. 15, 2004 and Korean patent application number KR 10-2003-0049157 filed on Jul. 18, 2003, the entire contents of which are incorporated herein by reference.

FIELD OF THE INVENTION

The present invention relates to a method of fabricating a precursor solution using superconducting oxide powder as a starting material, a method of coating a substrate (e.g., ceramic, nickel metal, nickel alloy, stainless steel, and the like) with an epitaxial thin film using the precursor solution, and a high-temperature superconductor fabricated by the methods.

BACKGROUND

In order to deposit a superconducting thin film containing $REBa_2Cu_3O_{7-X}$ (wherein RE is a rare earth element such as Y, La, Ce, Pr, Nd, Pm, Sm, Eu, Gd, Tb, Dy, Ho, Er, Tm, Yb, Lu, and the like, or a mixture of such elements) on a metal-oxide template made by depositing a textured oxide coating material on a {100}<100> textured nickel, a nickel base alloy, or a metal substrate made by epitaxially depositing a nickel on a nickel base alloy or a metal substrate, which is formed by depositing a textured ceramic layer on an alloy such as stainless steel or hastalloy using a metal organic deposition (MOD) method, it is necessary to fabricate an organic metal precursor solution containing cation ions of oxide superconductors such that an epitaxial thin film is effectively formed during heat treatments for high quality superconducting films with a critical current density over $10^5$ A/cm$^2$.

Further, after depositing the organic metal precursor solution on the substrate, it is necessary to effectively control oxygen partial pressure, water vapor pressure (P), heat treatment temperature, heat treatment time, gas flow, and the like.

However, among the metal organic solvents used to fabricate a high-temperature superconducting thin film by a method using such a chemical solution to date, the one showing the most excellent characteristics is trifluoro-acetic acid (TFA) solution.

In the typical method of fabricating the precursor solution to date, the precursor solution is made by respectively dissolving yttrium (Y)-acetate, barium (Ba)-acetate, and copper (Cu)-acetate into the TFA solution in accordance with cation ratios of a final superconducting product (for example, Y:Ba:Cu=1:2:3), and then, through a vaporizing distillation process and a remelting-polymerization process (refluxing), the precursor solution, in which a cation ratio of Y, Ba, Cu is 1:2:3, is fabricated and deposited on the substrate.

This method is carried out by dissolving acetate materials of Y, Ba, Cu into the TFA solution to form a cationic polymer having 123 composition ratios through a polymerization process, and by gelating to achieve a TFA polymer of Y, Ba, Cu in a jelly state, and by diluting the polymer with methanol, so as to provide a material to be used as a deposition solution.

SUMMARY

In the processes described above, it is necessary to exactly adjust the respective ratios and the respective purities of Y, Ba, and Cu acetate. The cost of the acetate used in this technology is high. Also, if a high purity metal acetate is not used, the process and the product are vulnerable to impurities. Furthermore, it is necessary to precisely control fabrication conditions of the precursor solution in order to create a good polymer. Also, in order to use a rare earth metal other than yttrium, it is necessary to prepare an acetate containing other rare earth metal elements. It is also difficult to add other elements alloys.

Therefore, an object of the present invention is to solve problems involved in the prior art, and to provide a method of fabricating a precursor solution in which cation ratios of a rare earth element or a solid solution of rare earth metals (yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu) and the like), barium, and copper is preferably 1:2:3.

Another object of the present invention is to provide a method of fabricating a superconducting conductor by epitaxially depositing at least one ceramic buffer layer (one of $CeO_2$, MgO, YSZ, $SrTiO_3$, $LaAlO_3$, $RuSrO$, $Gd_2O_3$, $Y_2O_3$, or a mixture thereof) on a {100}<100> textured metal substrate, and using an MOD method, eptaxially depositing $REBa_2Cu_3O_{7-X}$ (wherein RE is a rare earth element such as Y, La, Nd, Sm, Eu, Gd, Tb, Dy, Ho, Er, Tm, Yb, Lu, and the like, or a mixture thereof) group of a superconducting thin film.

BRIEF DESCRIPTION OF THE DRAWINGS

The above objects, other features and advantages of the present invention will become more apparent by describing a preferred embodiment thereof with reference to the accompanying drawings, in which:

FIG. 1 is a flowchart illustrating processing sequences of a superconducting thin film formation process.

FIG. 2 is a graph illustrating a process of calcination heat treatment of a superconducting material powder-TFA solution.

FIG. 3 is a graph illustrating a process of conversion heat treatment of a superconducting thin film.

FIG. 4 is a graph illustrating an X-ray diffraction analysis result of the fabricated superconducting thin film.

FIGS. 5, 6, 7, and 8 are views illustrating micro structures of the fabricated superconducting thin film.

FIG. 9 is a graph illustrating measurement results of a critical transition temperature of the fabricated superconducting thin film.

FIG. 10 is a graph illustrating measurement results of a critical current density of the fabricated superconducting thin film.

DETAILED DESCRIPTION

The present invention may include the acts of dispersing a superconducting material powder in a TFA acid aqueous solution, heating to dissolve the powder in the TFA acid aqueous solution, agitating the solution at an elevated temperature until the powder is completely dissolved and the solution is clear, maintaining the solution at an elevated temperature until the solution is vaporized and is in a viscous jelly state, stopping heating if the solution loses its flowing property completely, cooling the solution, and melting the compound in the jelly state, hardened at a room temperature, into an organic solvent (preferably methanol) to provide a Yttrium-TFA/Barium-TFA/Copper-TFA solution for coating. Alternately, vaporization of the dissolved solution is vacuum dried.

Preferably, a total cation concentration of the Yttrium-TFA/Barium-TFA/Copper-TFA solution for coating may be in the range of 0.1~6 mol.

Preferably, the superconducting material powder may be $REBa_2Cu_3O_{7-x}$ (wherein RE is a rare earth element such as Y, La, Ce, Pr, Nd, Pm, Sm, Eu, Gd, Tb, Dy, Ho, Er, Tm, Yb, Lu, and the like, or a combination thereof) with a cation ratio of RE:Ba:Cu=1:2:3. However, the cation ratio of RE:Ba is varied depending on the selected rare earth metal as RE:Ba=1−x:2(1+x)(−0.2<x<0.2).

Furthermore, the superconducting material powder may preferably use a powder of 123 compound prepared from a mixture of rare earth elements (Ya, Ybb, Smc, Lad, Nde, Hof, Gdg . . . )1Ba2Cu3O7−x (wherein a+b+c+d+e+f+g+ . . . =0<x<0.5).

Preferably, the organic solvent may be one selected from the group consisting of methyl alcohol, ethyl alcohol, and methoxy ethanol (methylol glycol monomethyl ether).

In another aspect of the present invention, there is provided a method of fabricating a thin film-type superconductor using a metal organic deposition method, wherein the method may include the processing acts of dispersing a superconducting material powder in a TFA acid aqueous solution, heating to dissolve the powder in the TFA solution, keeping the TFA acid aqueous solution until the powder is completely dissolved and the solution is clear, maintaining the solution at an elevated temperature until the solution is vaporized and is in a viscous jelly state, stopping heating if the solution loses its fluidity completely, cooling the solution, melting the compound in the jelly state, hardened at a room temperature, into an organic solvent (preferably methanol) to provide a Yttrium-TFA/Barium-TFA/Copper-TFA solution for coating, depositing the Yttrium-TFA/Barium-TFA/Copper-TFA solution for coating on a textured metal substrate having at least one oxide buffer layer thereon or a thin single crystal substrate; drying the precursor solution after depositing it to form a thin film, and applying calcination and conversion heat treatments to the thin film to provide the thin film with a superconducting property.

Preferably, the act of depositing a thin film may use spin coating, dipping coating, spray coating, or a transfer system such as slot die coating.

The operation of depositing a thin film is made atop of the textured metal substrate or the single crystal substrate. The textured metal substrate and the single crystal substrate may have a ceramic middle layer deposited thereon, and function to prevent the reaction with a superconducting layer on the metal surface and transfer the crystallinity of the biaxially aligned texture of substrate to the superconducting layer. The textured metal substrate is comprised of rolled heat-treated Ni, Ni-based alloy (Ni—W, Ni—Cr, Ni—Cr—W, etc.), silver or silver alloy, and cubic crystal metal such as Ni-silver complex or alloy. The single crystal is such as MgO(100), $LaAlO_3$ (100), $SrTiO_3$(100), and the like.

Preferably, a total cation concentration of the Yttrium-TFA/Barium-TFA/Copper-TFA solution for coating may be in the range of 0.1~6 mol.

Preferably, the superconducting material powder may use $REBa_2Cu_3O_{7-x}$ (where RE is a rare earth element such as Y, La, Ce, Pr, Nd, Pm, Sm, Eu, Gd, Tb, Dy, Ho, Er, Tm, Yb, Lu, and the like, or a mixture thereof).

Preferably, the organic solvent may be one selected from the group consisting of methyl alcohol, ethyl alcohol, and methoxy ethanol (methylol glycol monomethyl ether).

Reference will now be made in detail to preferred embodiments of the present invention, examples of which are illustrated in the accompanying drawings.

In the following explanation, a description with reference to the accompanying drawings is presented in order to facilitate a more complete understanding of the present invention, although it will be apparent to those skilled in the art that the present invention can be carried out without a detailed description of the drawings.

Description of elements or constituents of known technology will be omitted if it obscures the point of the present invention unnecessarily. This is intended to avoid any possibility of obscuring the description of the present invention.

FIG. 1 illustrates a method of producing a superconductor having a superconductivity, which is formed by preparing a precursor solution using an oxide powder, and depositing it on a substrate, and then performing a heat treatment thereon.

FIG. 2 illustrates a process of calcination heat treatment of a superconducting material powder-TFA solution.

FIG. 3 illustrates a process of conversion heat treatment of a superconducting thin film.

FIG. 4 illustrates an X-ray diffraction analysis result of the fabricated superconducting thin film.

Accordingly, the oxide superconducting phase is aligned in a (c) axis.

FIGS. 5, 6, 7, and 8 illustrate that superconducting crystal grains are formed, as shown from examination of specimen micro structures.

FIG. 9 illustrates the measurement result of a superconducting critical temperature of the specimen, which is converted into a superconducting state below 89.3 K.

FIG. 10 illustrates the measurement result of a superconducting critical current density of the specimen, in which a critical current density is 0.85 $MA/cm^2$ when a thickness of a thin film is 0.3 μm and has a width of 3 mm.

Now hereinafter, a method of the present invention will be explained with reference to an exemplary embodiment.

$1/100$ mol of a superconducting powder, $YBa_2Cu_3O_{7-x}$ is solved into 30 cc of a TFA acid aqueous solution. At this time, the solution may be heated in order to completely dissolve the superconducting oxide powder preferably below 80° C.

If the powder is completely dissolved and the solution is clear, the temperature of the solution is kept below 80° C. so as to vaporize the solution until the solution is changed into a viscous jelly state. If the solution almost loses its fluidity, heating is stopped and the solution is cooled.

The compound in a jelly state, which is hardened at a room temperature, is dissolved into 20 cc of methyl alcohol, to provide a Yttrium-TFA/Barium-TFA/Copper-TFA solution for coating with 1~6 mol of a total cation concentration.

Dropping the precursor solution on a rotating substrate, a thin film is deposited on a $LaAlO_3$ single crystal substrate, or the deposition may use coating technique such as dipping, spraying, transferring, and the like. Then, through a drying process, a precursor thin film is formed.

As shown in FIG. 2, a calcination heat treatment is carried out on the precursor thin film to vaporize solvent and impurities such as water and TFA acid, and to form a calcined thin film. Through a heat treatment as shown in FIG. 3, a superconducting phase is formed on the substrate.

The calcination heat treatment is carried out in the presence of oxygen, nitrogen, argon containing water vapor with a dew point of 20~75° C., or a mixture thereof, at a heating speed of 0.5~1° C. per minute, and the heating is carried out up to a temperature of 300~500° C. to decompose the metal organic precursor consisting of metal ions and TFA.

The conversion heat treatment is carried out by heating in the presence of nitrogen, or argon containing oxygen of 100~1000 ppm and water vapor with a dew point of 20~75° C., for 0.25~4 hours at a temperature of 650~850° C., so as to convert the calcined film into epitaxailly grown oxide superconductor thin film.

During conversion heat treatment, thin film is heated at a heating rate of 5~20° C. per minute up to a temperature of 650~850° C., and is maintained for 0.25~4 hours until the calcined film, which consists of oxides and oxyfluoride, is fully converted into REBCO oxide superconductor phase </p>.

In the temperature range of 400~500° C. during cooling, the thin film is maintained in a dry oxygen atmosphere for 1~4 hours, so as to sufficiently fill the REBCO oxide phase with an oxygen gas and to result in superconductivity.

As described above, the present invention provides a method of fabricating a thin film superconducting conductor using $REBa_2Cu_3O_{7-x}$ (wherein RE is a rare earth element such as Y, La, Ce, Pr, Nd, Pm, Sm, Eu, Gd, Tb, Dy, Ho, Er, Tm, Yb, Lu, and the like, or a mixture thereof), and wherein in the method, a precursor solution is fabricated by dissolving $REBa_2Cu_3O_{7-x}$ (wherein RE is a rare earth element such as Y, La, Ce, Pr, Nd, Pm, Sm, Eu, Gd, Tb, Dy, Ho, Er, Tm, Yb, Lu, and the like, or a mixture thereof) group of oxide into TFA acid aqueous solution, and using the precursor solution, a superconducting conductor can be created. The precursor solution can be created more easily and at a lower price than a conventional precursor solution.

While the present invention has been described and illustrated herein with reference to preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A method of preparing a precursor solution for depositing an organic metal using a superconducting oxide comprising:
   a) dissolving a superconducting raw material powder comprises $REBa_2Cu_3O_{7-x}$, wherein in RE is at least one rare earth element, in a TFA solution and then heating the resultant solution;
   b) applying the solution onto a substrate;
   c) elevating the substrate temperature to evaporate the solution if the powder is completely dissolved and the solution becomes clear, and continuously heating the solution until it is in the form of a compound in a viscous jelly state;
   d) stop heating the TFA acid aqueous solution when the solution loses fluidity completely and cooling the solution; and
   e) dissolving the $REBa_2Cu_3O_{7-x}$ compound in the jelly state, hardened at a room temperature, in an organic solvent, to provide a superconducting raw material powder-TFA precursor solution.

2. The method as claimed in claim 1, wherein a total cation concentration of the superconducting raw material powder-TFA precursor solution is in the range of 0.1 to 6 mol/L.

3. The method as claimed in claim 1, wherein the superconducting raw material powder comprises a powder of 123 compound $(Y_a, Yb_b, Sm_c, La_d, Nd_e, Ho_f, Gd_g \ldots )_1 Ba_2Cu_3O_{7-x}$ $(a+b+c+d+e+f+g+ \ldots =1, 0<x<0.5)$.

4. The method as claimed in claim 1, wherein the superconducting raw material powder is one of the following mixtures of compounds: $RE_2CuO_4$ (RE=at least one rare earth element), $BaCuO_2$, $RE_2Ba_1Cu_1O_5$ (RE=at least one rare earth element), $RE_4Ba_2Cu_2O_{10}$ (RE=at least one rare earth element), and $RE_1Ba_2Cu_4O_x$ (RE=at least one rare earth element) in a ratio of RE:Ba:Cu=1:2:3.

5. The method as claimed in claim 1, wherein the organic solvent is any one selected from the group consisting of methyl alcohol, ethyl alcohol, methoxy ethanol (methylol glycol monomethyl ether).

6. A method of fabricating a thin film superconductor using an organic metal deposition method comprising:
   a) dissolving a superconducting raw material powder comprises $REBa_2Cu_3O_{7-x}$, wherein in RE is at least one rare earth element, in a TFA solution and then heating the resultant solution;
   b) applying the solution onto a substrate;
   c) elevating the substrate temperature to evaporate the solution if the powder is completely dissolved and the solution becomes clear, and continuously heating the solution until it is in the form of a compound in a viscous jelly state;
   d) stop heating when the solution loses its fluidity completely and cooling the solution;
   e) dissolving the $REBa_2Cu_3O_{7-x}$ compound in the jelly state, hardened at a room temperature, in an organic solvent, to provide a superconducting raw material powder-TFA precursor solution;
   f) applying a thin film by depositing the superconducting raw material powder-TFA precursor solution on a textured metal substrate or single crystal metal substrate;
   g) drying the applied thin film; and
   h) subjecting the thin film to a calcination heat treatment and a conversion heat treatment to provide superconducting property.

7. The method as claimed in claim 6, wherein the step of applying the thin film is performed by spin coating, dip coating, spray coating, or transfer system.

8. The method as claimed in claim 6,
   wherein the textured metal substrate is comprised of a rolled heat-treated Ni, Ni-based alloy, silver or silver alloy, and a cubic crystal metal;
   wherein the textured metal substrate or single crystal substrate has a ceramic intermediate layer deposited thereon; and
   wherein the ceramic intermediate layer assists in preventing the substrate from reacting with the superconducting layer and transferring the crystallinity of the biaxially oriented texture.

9. The method as claimed in claim 6, wherein a total cation concentration of the superconducting raw material powder-TFA precursor solution is in the range of 0.1 to 6 mol/L.

10. The method as claimed in claim 6, wherein the superconducting raw material powder is a 123 compound prepared from a mixture of rare earth elements $(Y_a, Yb_b, Sm_c, La_d, Nd_e, Ho_f, Gd_g \ldots )_1 Ba_2Cu_3O_{7-x}$ $(a+b+c+d+e+f+g+ \ldots =1, 0<x<0.5)$ containing other rare earth elements in addition to Y, Sm and Nd.

11. The method as claimed in claim 6, wherein the superconducting raw material powder is one of the following mixtures of compounds: $RE_2Cu_2O_4$ (RE=at least one rare earth element), $RE_2CuO_4$ (RE=at least one rare earth element), $BaCuO_2$, $RE_2Ba_1Cu_1O_5$ (RE=at least one rare earth element), $RE_4Ba_2Cu_2O_{10}$ (RE=at least one rare earth element), and $RE_1Ba_2Cu_4O_x$ (RE=at least one rare earth element) in a ratio of RE:Ba:Cu=1:2:3.

12. The method as claimed in claim 6, wherein the organic solvent is one selected from the group consisting of methyl alcohol, ethyl alcohol, and methoxy ethanol (methylol glycol monomethyl ether).

* * * * *